US008507784B2

(12) United States Patent
White

(10) Patent No.: US 8,507,784 B2
(45) Date of Patent: Aug. 13, 2013

(54) PHOTOVOLTAIC SHINGLES FOR ROOFING AND METHOD FOR CONNECTING THE SHINGLES

(75) Inventor: Troy White, Charlottesville, VA (US)

(73) Assignee: General Electric Company, Schenectady, NY (US)

( * ) Notice: Subject to any disclaimer, the term of this patent is extended or adjusted under 35 U.S.C. 154(b) by 920 days.

(21) Appl. No.: 12/147,909

(22) Filed: Jun. 27, 2008

(65) Prior Publication Data

US 2009/0320389 A1 Dec. 31, 2009

(51) Int. Cl.
*H01L 31/042* (2006.01)
(52) U.S. Cl.
USPC ............. 136/244; 136/251; 52/173.3; 52/518
(58) Field of Classification Search
USPC .................. 136/244, 251; 52/173.3, 518
See application file for complete search history.

(56) References Cited

U.S. PATENT DOCUMENTS

| | | |
|---|---|---|
| 3,627,585 A | 12/1971 | Dollery et al. |
| 4,040,867 A | 8/1977 | Forestieri et al. |
| 4,674,244 A | 6/1987 | Francovitch |
| 4,835,918 A | 6/1989 | Dippel |
| 4,860,509 A | 8/1989 | Laaly et al. |
| 5,482,569 A | 1/1996 | Ihara et al. |
| 5,575,861 A | 11/1996 | Younan et al. |
| 5,787,653 A | 8/1998 | Sakai et al. |
| 5,968,287 A | 10/1999 | Nath |
| 5,990,414 A | 11/1999 | Posnansky |
| 6,148,570 A | 11/2000 | Dinwoodie et al. |
| 6,553,729 B1 | 4/2003 | Nath et al. |
| 6,660,930 B1 | 12/2003 | Gonsiorawski |
| 2001/0054262 A1 | 12/2001 | Nath et al. |
| 2004/0144043 A1 | 7/2004 | Stevenson et al. |
| 2008/0149170 A1* | 6/2008 | Hanoka .................. 136/251 |
| 2008/0245405 A1* | 10/2008 | Garvison et al. .......... 136/251 |

FOREIGN PATENT DOCUMENTS

| | | |
|---|---|---|
| DE | 43 17 674 A1 | 12/1994 |
| DE | 198 28 462 A1 | 1/2000 |
| EP | 0 379 961 A1 | 8/1990 |
| JP | 8-114013 | 5/1996 |
| JP | 09051118 A | 2/1997 |
| JP | 11-026794 | 1/1999 |
| JP | 2000129876 A1 | 5/2000 |
| JP | 2000145015 A | 5/2000 |
| JP | 2000145074 A | 5/2000 |
| JP | 2000150949 A | 5/2000 |
| JP | 2000164909 A | 6/2000 |
| JP | 2001332752 A | 11/2001 |
| WO | WO 94/13020 A1 | 6/1994 |
| WO | WO 2004/066324 A2 | 8/2004 |

OTHER PUBLICATIONS

JPO machine translation of JP 2001-332752.
Terri Suess et al., "Eliminate Your Electric Bill—Go Solar—Be Secure", Mother Earth News, Feb./Mar. 2002, pp. 72-82.

(Continued)

*Primary Examiner* — Xiuyu Tai
(74) *Attorney, Agent, or Firm* — Nixon & Vanderhye P.C.

(57) ABSTRACT

A shingle including a flexible sheet; a photovoltaic panel attached to the flexible sheet; an electrical conductive path extending from a first side of the shingle to an opposite side of the shingle; a connector on one end of the electrical conductive path, and a mating connector on an opposite end of the electrical conductive path.

7 Claims, 2 Drawing Sheets

(56) References Cited

OTHER PUBLICATIONS

"Uni-Solar Roofing PV", Dovetail Solar & Wind, pp. 1-4, (2004).
Keith Pandolfi Solar Shingles, This Old House Magazine, pp. 1-3, 2007.
"Solar Shinges", Wikipedia, pp. 1-3, printed Jun. 17, 2008.
Lamont Wood, "Beyond the Solar Panel", Technology Review: Beyond the Solar Panel, pp. 1-6, Jul. 7, 2006.
"Soloar Shingles, Photovoltaic Roof Panels, PV Energy Shingle", www.opticalenergy.com/photovoltaic-solar-shingels-pv-energy-..., pp. 1-3, printed Jun. 17, 2008.
"Roof Shingles Roof Shingles, and Photovoltaic Shingles", OkSolar.com, pp. 1-8, printed Jun. 17, 2008.

* cited by examiner

PHOTOVOLTAIC SHINGLES FOR ROOFING AND METHOD FOR CONNECTING THE SHINGLES

BACKGROUND OF THE INVENTION

The present invention relates to photovoltaic panels (also referred to as solar panels) and, specifically, to such panels for installation a roof of a home or building.

Roof shingles incorporating solar panels have recently been developed. A difficulty with conventional solar panel shingles relates to making the electrical connection between the shingles and to an electrical system to receive the power generated in the panels. The electrical connections between solar panel shingles and to an electrical system tend to be complicated and difficult to install.

The persons, e.g., roofers, who typically install shingles are often not trained in making electrical connections. Roofers tend to be efficient at installing shingles on a roof, such as by laying shingles in successive rows to cover the roof. Roofers do not typically make electrical connections or install electrical devices on a roof. There is a need for roof shingles having solar panels that are simple and easy to install on a roof and connect to an electrical system. Specifically, there is a need for roof shingles that incorporate solar panels and can be installed by roofers with conventional roofing skills.

BRIEF DESCRIPTION OF THE INVENTION

A shingle has been developed having a flexible sheet; a photovoltaic panel attached to the flexible sheet; an electrical conductive path extending from a first side of the shingle to an opposite side of the shingle; a connector on one end of the electrical conductive path, and a mating connector on an opposite end of the electrical conductive path.

A roofing assembly has been developed comprising: a plurality of shingles, wherein each shingle includes a photovoltaic panel, an electrical conductive path extending from a first side of the shingle to an opposite side of the shingle and receiving power generated in the photovoltaic panel, a first connector on one end of the electrical conductive path, and a second connector on an opposite end of the electrical conductive path; a row of said shingles wherein the shingles are arranged side-by-side on a roof and, in the row, the first connector and second connector are connected for side-by-side shingles and the connected connectors establish an extended conductive path through each of the conductive paths in the shingles of the row, and a termination bus connected the first connector of one of said shingles in the row, wherein the termination bus includes a termination conductive path extending substantially transverse to the row of shingles and said termination conductive path is electrically coupled to each shingle in the row.

A method has been developed to install roofing shingles having photovoltaic panels on a roof, wherein each of the roofing shingles includes a conductive bus extending from one side of the shingle to an opposite side of the shingle and one end of the conductive bus includes a first connector and a second end of the bus includes a second connector, the method comprising: affixing a first shingle of said shingles to the roof; arranging a second shingle of said shingles on the roof and in a row with the first shingle; coupling of the first connector of the second shingle with the second connector of the first shingle; affixing the second shingle to the roof; repeating with successive shingles the arranging, coupling and affixing steps to form a row of shingles on the roof by arranging another single on the roof next to an affixed shingle, and inserting the first connector of a shingle at the end of the row into a termination conductive bus transverse to the row and affixed to the roof, wherein the termination conductive bus is electrically connected to the shingles in the row by the conductive bus in the shingles of the row and the coupling between the first and second connectors of the shingles.

DETAILED DESCRIPTION OF THE INVENTION

Figure 1:
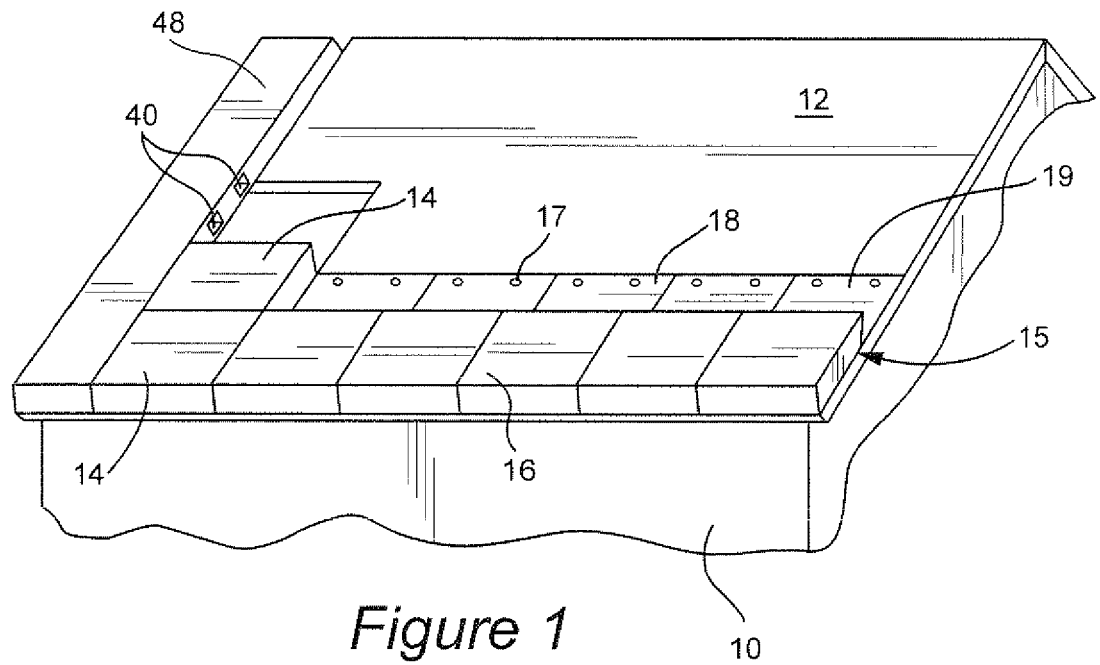
FIG. 1 shows a roof of a building on which solar panel shingles are being installed.

FIG. 1 shows a building 10 having a roof 12 that is being covered by shingles 14. The shingles protect the roof from rain, snow, wind and other weather conditions. Roof shingles shield are arranged side-by-side in rows 15. Each row of shingle partially overlaps a lower row and is partially overlapped by an upper row. The rows of shingles cover the entire roof. Shingles and conventionally installed by nailing 17 each shingle to the row and arranging the singles in a row. When one row of shingles has been nailed to the roof, a second row is formed by partially overlapping the shingles over the prior row and nailing the shingles to the roof.

The shingles 14 each include a photovoltaic panel 16 that is exposed to the sun. The photovoltaic panel is affixed to the portion of the shingle that is exposed when the shingles are affixed to the roof. The other portion of the shingle is a nail down sheet 18 that does not include a photovoltaic panel. The nail down sheet is covered by an overlapping shingle when affixed to the roof. The shingles are preferably arranged on the roof such that an entire surface of a roof 12 is covered with photovoltaic panels.

The shingles 14 are electrically connected to each other along rows of shingles. Each shingle includes two male connectors along one side and two female connectors along its opposite side. The male connectors and female connectors in each shingle are connected to each other by conductive busses that span the width of the single. The photovoltaic cells in the shingle are electrically connected to one or both of the busses in the shingle.

The shingles are installed side-by-side on a roof. The side-by-side installation forms rows 15 of shingles on the roof. As each shingle is positioned on the roof next to another shingle, one or more electrical connectors on the side of the single are inserted into mating electrical connectors on a side of the another shingle. The connection between electrical connectors on the sides of the singles is formed as one shingle is positioned next to another shingle. Preferably, the connection is formed simply by sliding one connector into another. It is preferred that the electrical connection between the photovoltaic panels on adjacent shingles is formed by simply inserting one or more connectors on one side of a shingle into the mating connector(s) on an opposite side of another connector.

The installation action of positioning one shingle next to another single in a row of shingles on a roof is a conventional installation method commonly used by roofers. Substantially the same conventional installation action is used to install shingles 14 having photovoltaic panels 16 and electrically connect the panels to adjacent shingles. As the roofer applies a new shingle, he or she positions the shingle next to the last installed shingle in a row and slides the connector of the new shingle into the mating connector in the last installed shingle. It is preferably not necessary for the roofer to perform additional steps to electrically connect shingles, such as splicing connecting wires together, extending wires through the roof or adjusting connections. The installation process is preformed by using conventional roofing practices applied to install conventional shingles, with the slight modification that connectors on the sides of the shingles are coupled as the shingles are placed on the roof.

Figure 2:
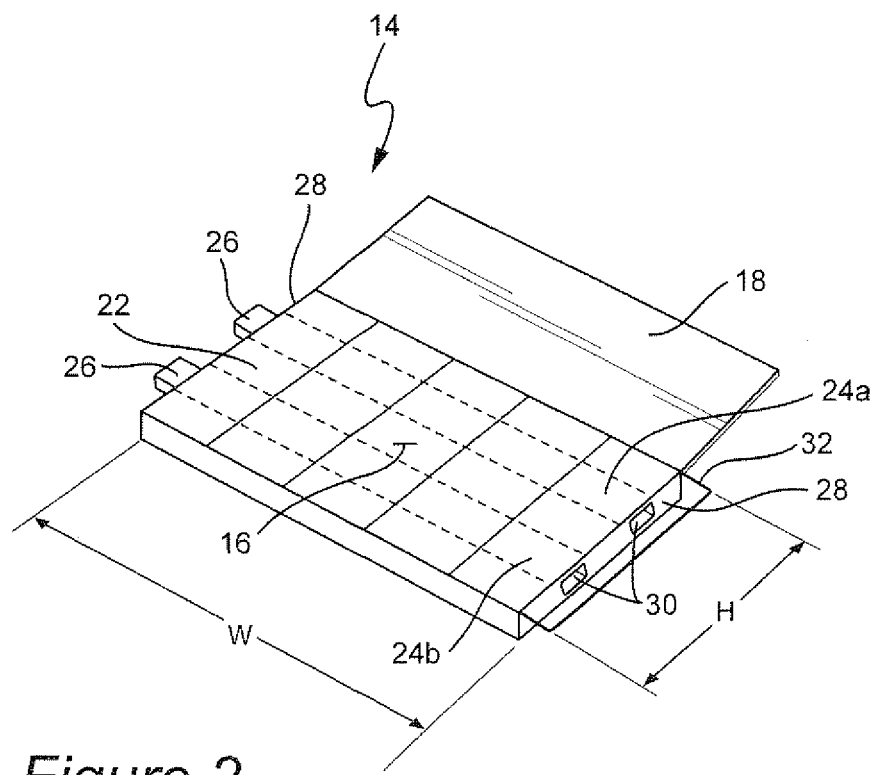
FIG. 2 shows a shingle including solar panels.

FIG. 2 is a plan view of a shingle 14 that includes a solar photovoltaic panel 16 and a nail-down sheet 18. When the shingle 14 is installed on a roof, the photovoltaic panel 16 is exposed to the sun and the nail-down sheet underlies an adjacent shingle(s). Preferably the nail-down sheet 18 has substantially the same surface dimensions as does the photovoltaic panel. The nail-down sheet forms a support base for the photovoltaic panel of the shingle installed in an adjacent row. The nail down sheet may be a conventional roofing shingle material, such as a asphalt and fiber sheet, a plastic sheet or other non-woven material. Preferably, the nail-down sheet is deformable and conforms to the bottom surface of the photovoltaic panel installed over the nail-down sheet.

The nail-down sheet 18 may form a base substrate for the photovoltaic panel of the shingle. The photovoltaic panel may be mounted on one half of the nail-down sheet. The remaining half of the nail-down sheet is exposed to be attached to the roof and to provide a support base for the photovoltaic panels of the shingles in the adjacent row. The nail-down sheet may provide the weather protection for the roof that is provided by conventional shingles.

Each shingle has one or more photovoltaic panels 16. Each panel is formed of photovoltaic cells 22. Preferably, the photovoltaic cells and panels are flexible, at least to the same degree of that a conventional asphalt shingle is flexible. However, flexibility of the panels 16 is not required, as some conventional shingles, e.g., slate, are not flexible.

The shingles 14 are typically rectangular in shape and may have dimensions of one to two feet (0.3 to 0.6 meter) by three to four feed (1.0 meter by 1.3 meter). The dimensions of the shingle are a matter of design choice. Half-width shingles 19 may be used at the ends of alternating rows to ensure that each row of shingles is offset horizontally from the adjacent rows. The offset allows the nail-down sheet of each shingle to overlap the gap between the nail-down sheets of adjacent shingles in the preceding row.

Each shingle 14 has at least one bus 24a or 24b that spans the width shingle. Preferably, there is a first and second buses 24a, 24b both extending widthwise (W) across the single and each arranged a distance from an end of the panel 16 approximately one third of the height (H) of the panel. The busses 24a, 24b are shown by dotted lines in FIG. 2 to represent that the busses are below the panels 16. The buses 24a, 24b may be an aluminum bar or other conductive material. The buses may be internal to the photovoltaic panel or affixed to a bottom of the panel. The busses 24a, 24b are electrically connected to the photovoltaic cells in the panel 16 and preferably one bus 24a is connected to the positive terminals of the cells 22 in the panels 16 and the other bus 24b is connected to the negative terminals of the cells.

One end of each bus 24a, 24b as a male connector 26 that protrudes from the side of the shingle. The male connector preferably extends laterally from the side 28 of the shingle. The other end of each bus 24a, 24b includes a female connector 30 adapted to receive a male connector of a bus from an adjacent shingle. The female connector may be aligned with or slightly recessed under the edge of the shingle 28.

When shingles are arranged side-by-side the male connectors 26 on one side of a shingle couples with, e.g., slides into, the female connectors 30 on the opposite side of an adjacent shingle. The coupling of the male and female connectors electrically connects the buses 24a, 24b of the adjacent shingles.

A transparent sheet 32 may extend from the side 28 of a shingle having the female connector. The transparent sheet covers the gap between the sides of adjacent shingles and shields the coupled connectors 26, 30 from rain, snow and other weather conditions. The sheet may partially overlap the outer surface of the photovoltaic panel 16 without blocking or reducing the sunlight that passes through the transparent sheet. In addition or as an alternative to the sheet, a deformable gasket may extend around each female connector. The gasket protects the coupling between the connectors by sealing around the male connector or bus of the adjacent bus when the male connector is slid into the female connector.

Figure 3:
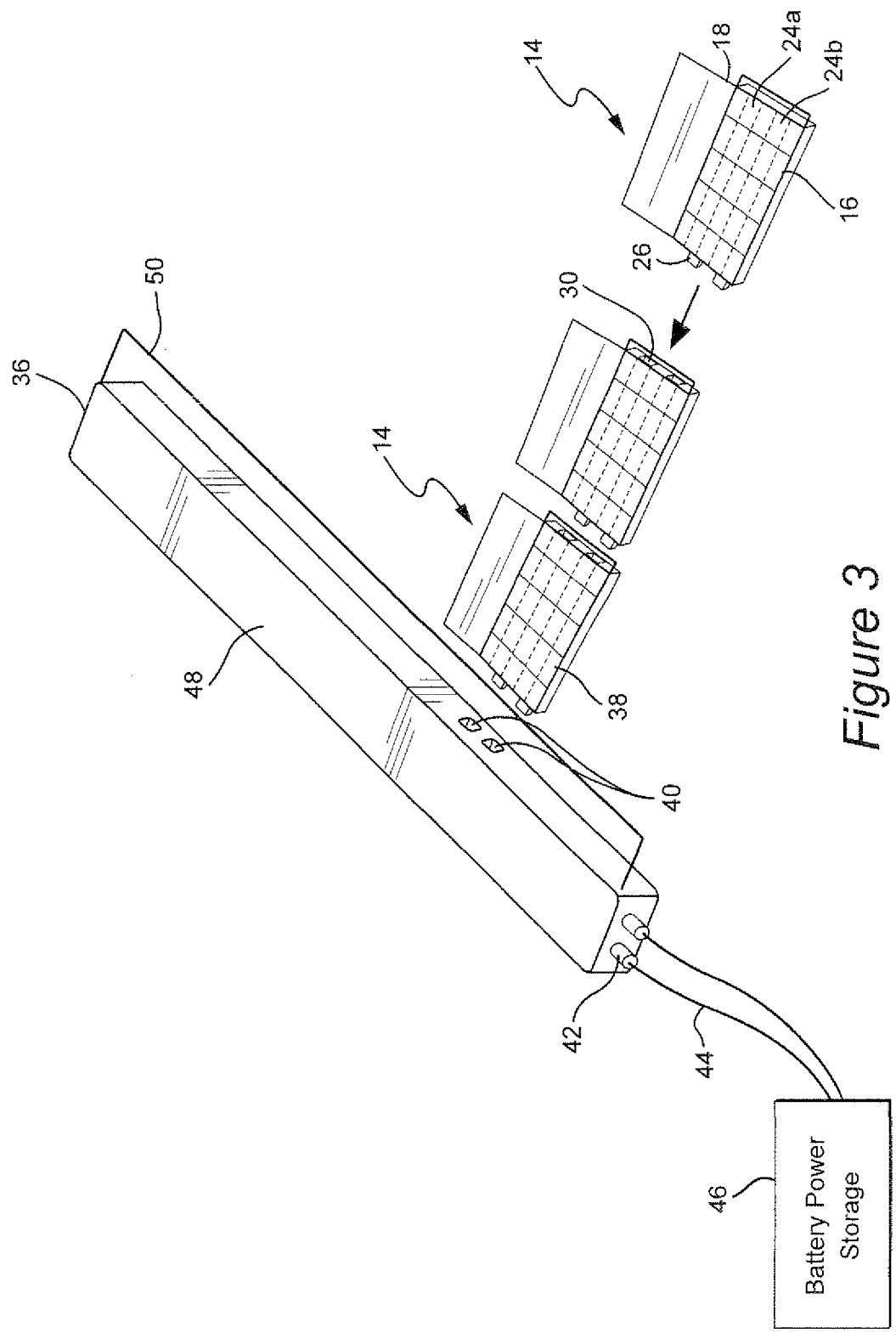
FIG. 3 shows an exploded view of a chain of shingles and a roof edge trim to which the shingles are electrically connected.

FIG. 3 shows how shingles 14 in a row 34 are electrically connected to all of the shingles in the row. Further, each single is physically connected to the adjacent shingles in the row by the coupling of the male and female connectors 26, 30. In addition, the end shingle is a row is electrically connected to a terminal conductor buses 36, e.g., a bus bar, attached to an edge of the roof. The terminal conductor bus 36 is physically connected to the shingle 38 at the end of the row 34 by the coupling between the male connector of the shingle and the female connector 40 of the terminal conductor bus.

The terminal conductor bus 36 may be a pair of conductive bars, e.g. a strip or bar of aluminum, each having along one side a row of female connectors 40. The pair of bars 34 may include a conductive bar for the positive voltage from the photovoltaic cells and a second conductor bar for the negative voltage from the photovoltaic cells. Each of the buses 36 may have an associated female connector 40 to receive the male connector of the corresponding positive or negative bus 24a, 24b in the shingle 38 at the end of each row of shingles. Further, a lateral end 42 of each conductor bar 34 may be connected to wiring 44 to a batteries or other electrical power storage system 46 for capturing the electrical power generated in the cells of the photovoltaic panels 16 mounted on the roof.

The terminal conductor buses 36 may include a housing 48, e.g., a plastic channel that shields the conductor bars 36 from weather conditions and includes an attachment strip for affixing, e.g., by nailing, the terminal conductor bus to an edges of the roof. The housing may include a transparent overhang ledge 50 that shields the coupling between the male connectors of the end shingles that are inserted in the female connectors 40 of the terminal conductor buses 40.

The terminal conductive buses 40 provide a conductive path for power from the photovoltaic panels in the rows of shingles. Current from the panels 16 flows through the positive and negative buses 24a, 24b in each shingle, through the connected buses 24a, 24b in each row of shingles, to the terminal conductor buses 36 and to a battery storage device 46, rectifier or other electrical device that captures the generated power and makes the power available for use in the building or for other purposes. Current passes through the conductor buses 24a, 24b of each shingle even if the photovaltic panel becomes disabled and does not generate current.

To install the shingles on the roof, a first row of shingles is affixed along a lower edge of the roof by nailing the nail-down sheet 18 to the roof. The nails 17 or staples extend through the nail-down sheet and secure the shingle to the roof. The affixing of the shingle to the roof is preformed in a conventional manner commonly used by roofers.

A second shingle is positioned on the roof adjacent the first shingle and along the lower edge of the roof to form a first row of shingles. When the second shingle is positioned on the roof, its male connectors are slid into the female connectors of the first shingle. When the male and female connectors are coupled together, the buses 24a, 24b in the singles are connected together.

Nails 17 are inserted through the nail-down sheet 18 of the second shingle to affix the shingle to the roof. The steps of positioning a new shingle next to a newly affixed shingle in a row shingles, coupling the connectors and affixing the new shingle to the roof are repeated until the row of shingles is completed.

When a first row of shingles is affixed to the roof, a second row of shingles is placed on the roof. The shingles of the second row overlap with the nail down sheet of the shingles in the first row. The rows are arranged such that the photovoltaic panels effectively cover the entire roof.

Each shingle of the next row is on a nail-down sheet of one or more of shingles in the preceding row. The nail-down sheet of the shingle in the next row is nailed to the roof. Each row of shingles is formed by connecting side-by-side shingles and nailing the nail-down sheet to the roof. Rows of shingles are installed on a roof until the entire roof is covered. The sides of the shingles slide into each other to connect electrically all of the shingles in a row. The connections between the shingles effectively extend the busses in each shingle along the entire row of shingles.

The terminal conductor buses 36 may be affixed to an edge of the roof that is transverse to the rows of the shingles. As the terminal conductor buses are affixed to the roof, the female connectors on the bus receive the male connectors of the shingles on the end of the row. The end of the terminal conductor bus 36 is connected to the wiring 44 of the battery system 46.

The connections between busses in the shingles ensure that power generated in a shingle will flow through the row of shingles to a common bus at the edge of the roof. An electrical failure in a shingle may disable the photovoltaic cells in the shingle. However, an electrical failure in a shingle should not disable the bus or prevent electrical current passing through the busses in the shingle. Accordingly, an electrical failure of the photovoltaic cells in a shingle should not prevent current generated in other shingles in the same row from reaching the common bus at the edge of the roof.

The shingles and terminal conductor buses may be installed on a roof in much the same manner as conventional shingles. The shingles and terminal buses are affixed to the roof in a conventional manner, such as by being nailed to the roof. A roofer need not have specialized electrical skills to couple the connectors of adjacent shingles or connect an end shingle to the terminal conductor bus. By using conventional techniques for installation, the cost and difficulty of installing the shingles and terminal conductor buses is significantly reduced as compared to installing conventional roofing shingles.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A roofing shingle comprising:
   a flexible sheet having a first portion adapted to receive a fastener to attach the shingle to a roof;
   a photovoltaic panel attached to a second portion of the flexible sheet, wherein the panel is entirely on the second portion, and the panel includes a first panel side edge proximate to a first side edge of the shingle and a second panel side edge proximate to a second side edge of the shingle;
   an electrical conductive path extending from a first side of the shingle to an opposite side of the shingle, wherein the electrical conductive path is electrically coupled to the photovoltaic panel;
   a connector on one end of the electrical conductive path, wherein the connector is adapted to couple to a mating connector of a first adjacent roofing shingle, and
   a mating connector on an opposite end of the electrical conductive path, wherein the mating connector is adapted to couple to a connector of a second adjacent roofing shingle.

2. The shingle as in claim 1 wherein the connector is a male connector and the mating connector is a female connector.

3. The shingle as in claim 1 wherein the connector extends from first side of the shingle and the mating connector extends from the opposite side of the shingle.

4. The shingle as in claim 1 wherein the an electrical conductive path includes a positive conductive path and a separate negative conductive path, and the positive and conductive paths each having a connector on one end and a mating connector on an opposite end of the respective paths.

5. The shingle as in claim 1 wherein the flexible sheet underlies the photovoltaic panel.

6. The shingle as in claim 1 wherein the photovoltaic panel is substantially coextensive with the second portion of the flexible sheet.

7. The shingle as in claim 1 wherein the electrical conductive path is a conductive bus bar.

* * * * *